United States Patent
Boonyatee et al.

(10) Patent No.: US 9,812,339 B1
(45) Date of Patent: Nov. 7, 2017

(54) METHOD OF ASSEMBLING SEMICONDUCTOR DEVICES OF VARYING THICKNESSES

(71) Applicant: NXP B.V., Eindhoven (NL)

(72) Inventors: Pimpa Boonyatee, Bangkok (TH); Pitak Seantumpol, Bangkok (TH); Paradee Jitrungruang, Bangkok (TH)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/495,915

(22) Filed: Apr. 24, 2017

(51) Int. Cl.
*H01L 21/56* (2006.01)
*H01L 23/28* (2006.01)
*H01L 21/78* (2006.01)
*H01L 23/495* (2006.01)
*H01L 23/00* (2006.01)
*H01L 23/31* (2006.01)

(52) U.S. Cl.
CPC .......... *H01L 21/561* (2013.01); *H01L 21/565* (2013.01); *H01L 21/568* (2013.01); *H01L 21/78* (2013.01); *H01L 23/3121* (2013.01); *H01L 23/49513* (2013.01); *H01L 24/13* (2013.01); *H01L 24/48* (2013.01); *H01L 2224/13024* (2013.01); *H01L 2224/48247* (2013.01); *H01L 2924/182* (2013.01); *H01L 2924/1815* (2013.01)

(58) Field of Classification Search
CPC ..... H01L 21/561; H01L 21/568; H01L 21/78; H01L 23/49513; H01L 2224/4824; H01L 21/565; H01L 23/3121; H01L 24/48; H01L 2924/1815; H01L 2924/181; H01L 2924/12042; H01L 24/04; H01L 24/13; H01L 2924/182
See application file for complete search history.

(56) References Cited

U.S. PATENT DOCUMENTS

| | | | |
|---|---|---|---|
| 6,506,681 B2 | 1/2003 | Grigg et al. | |
| 6,729,947 B1 | 5/2004 | Schutte et al. | |
| 7,888,183 B2 | 2/2011 | Liu et al. | |
| 2003/0218263 A1* | 11/2003 | Blaszczak | H01L 21/561 257/788 |
| 2006/0192295 A1* | 8/2006 | Lee | H01L 23/16 257/778 |
| 2009/0230567 A1 | 9/2009 | Kiong et al. | |
| 2013/0187174 A1* | 7/2013 | Tischler | H01L 33/50 257/80 |

* cited by examiner

*Primary Examiner* — Jasmine Clark
(74) *Attorney, Agent, or Firm* — Charles E. Bergere

(57) ABSTRACT

A method of packaging a semiconductor die includes the steps of mounting the semiconductor die on a carrier, electrically connecting electrical contact pads of the semiconductor die to external electrical contacts, and encapsulating the die with a mold compound to form a packaged die. The packaged die is then thinned by using a dicing saw blade to trim the mold compound off of the top, non-active side of the package using a series of vertical cuts. This thinning step can be performed at the same time as a normal dicing step so no additional equipment or process steps are needed. Further, packages of varying thicknesses can be assembled simultaneously.

14 Claims, 3 Drawing Sheets

METHOD OF ASSEMBLING SEMICONDUCTOR DEVICES OF VARYING THICKNESSES

BACKGROUND

The present invention relates to semiconductor die packaging and, more particularly, to a method of simultaneously assembling semiconductor devices having varying degrees of thickness.

There is a continual demand for smaller and thinner semiconductor devices. One method of producing thinner devices involves thinning a semiconductor wafer, and thus the dies on the wafer, by grinding the wafer backside prior to packaging. However, back-grinding the wafer can cause the wafer to warp and the dies to crack or chip, thus impacting reliability and yield. Another method is to thin already produced packages by grinding the molded body. However, it can be difficult to grind all of the devices uniformly and to a desired thickness. Moreover, all of the devices assembled using a molded array process (MAP) will have the same thickness.

It would be beneficial to be able to simultaneously produce packages of varying thicknesses yet still using a MAP.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION

Figure 1:
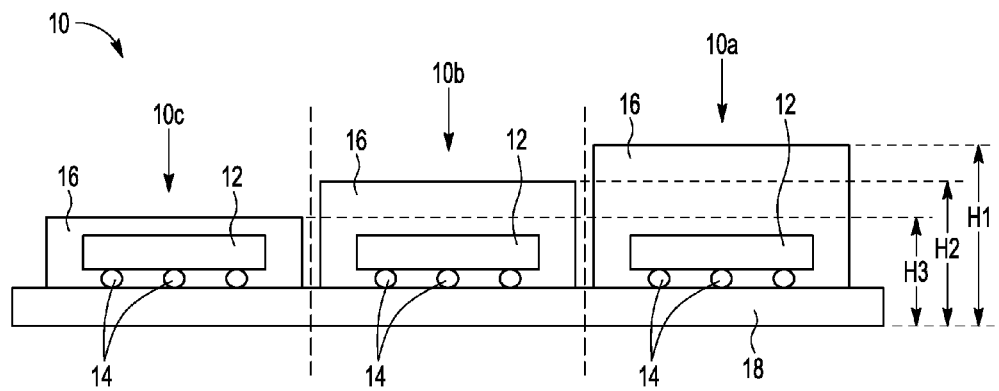
FIG. 1 is an enlarged side cross-sectional view of a plurality of semiconductor devices of varying thickness being assembled.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, the terms "comprises," "comprising," or any other variation thereof, are intended to cover a non-exclusive inclusion, such that a module, circuit, device components, structures and method steps that comprise a list of elements or steps does not include only those elements but may include other elements or steps not expressly listed or inherent to such module, circuit, device components or steps. That is, an element or step proceeded by "comprises . . . a" does not, without more constraints, preclude the existence of additional identical elements or steps that comprises the element or step.

In one embodiment, the present invention provides a method of packaging a semiconductor die, including the steps of mounting the semiconductor die on a carrier, electrically connecting electrical contact pads of the semiconductor die to external electrical contacts, and encapsulating the die with a mold compound to form a packaged die. The packaged die is then thinned using a dicing saw blade to trim the mold compound off of the top, non-active side of the package with a series of vertical cuts. This thinning step can be performed at the same time as a normal dicing step so no additional equipment or process steps are needed. Further, packages of varying thicknesses can be assembled simultaneously.

In another embodiment, the present invention provides a method of simultaneously forming a plurality of semiconductor devices having different thicknesses. The method includes providing a plurality of simultaneously assembled semiconductor devices, where the semiconductor devices comprise a plurality of semiconductor dies having their top sides covered with a mold compound, and wherein the devices all have a first thickness. A first set of the devices is thinned with a saw blade by reducing an amount of the mold compound on the top sides thereof with the saw blade. A second set of the devices then is thinned with the saw blade by reducing an amount of the mold compound on the top sides of the dies of the second set with the saw blade, where the second set does not include any of the dies of the first set, and a greater amount of the mold compound is removed from the devices of the second set such that the devices of the second set are thinner than the devices of the first set.

Referring now to FIG. 1, an enlarged cross-sectional side view of a plurality of packaged dies 10 having different heights or thicknesses, in accordance with an embodiment of the present invention, is shown. The packaged dies 10 are assembled simultaneously. Each packaged die 10 includes a flip-chip type semiconductor die 12 having conductive balls 14 attached to die contact pads (not shown), as is known in the art, and the dies 12 are encapsulated with a mold compound 16. The ball 14 attach and molding processes may be performed on each packaged die 10 at the same time. The dies 12 may be any type of semiconductor dies such as microcontrollers, memory circuits, etc. That is, the invention is not limited by the type or size of the dies 12.

The packaged dies 10 are mounted on a dicing tape 18 prior to saw singulation. In saw singulation, as in known in the art, the packaged dies 10 are separated one from another using a dicing saw. However, according to the present invention, the packaged dies 10 also are thinned by the dicing saw. For example, a first cut by the dicing saw separates packaged die 10a from 10b. Then one or more second cuts are performed in which the saw blade trims a top portion of the mold compound 16 off of the packaged die 10b. For the one or more second cuts, the saw blade may be moved laterally from one side of the packaged die 10b to the opposing side of the packaged die 10b—in this case, preferably from the side of the packaged die 10b adjacent to the packaged die 10a to the opposite side, which is adjacent to the packaged die 10c. A third cut then is performed to separate the packaged die 10b from the packaged die 10c, and then one or more fourth cuts are performed to thin the packaged die 10c. Finally, the dicing tape 18 is removed from the packaged dies 10, such as with heat, thereby exposing the conductive balls 14.

For example, as shown in FIG. 1, the packaged dies 10 all have a starting height of H1. After the second cuts are made, the packaged dies 10b have a height of H2, and after the fourth cuts, the packaged dies 10c have a height of H3. In one example, H1 is 850 mm, H2 is 450 mm, and H3 is 350 mm. In other examples, there are more than three rows of the packaged dies 10 mounted on the dicing tape 18 and each row is trimmed to a different height using the dicing saw. As will be understood by those of skill in the art, the dicing saw makes the first and third cuts to a depth sufficient to separate the packaged dies 10 from each other, while the second cuts are at a depth sufficient to trim enough of the mold compound 16 so that the packaged dies 10b have the height H2, and the fourth cuts are at a depth sufficient to trim enough of the mold compound 16 so that the packaged dies 10c have the height H3.

Figure 2:
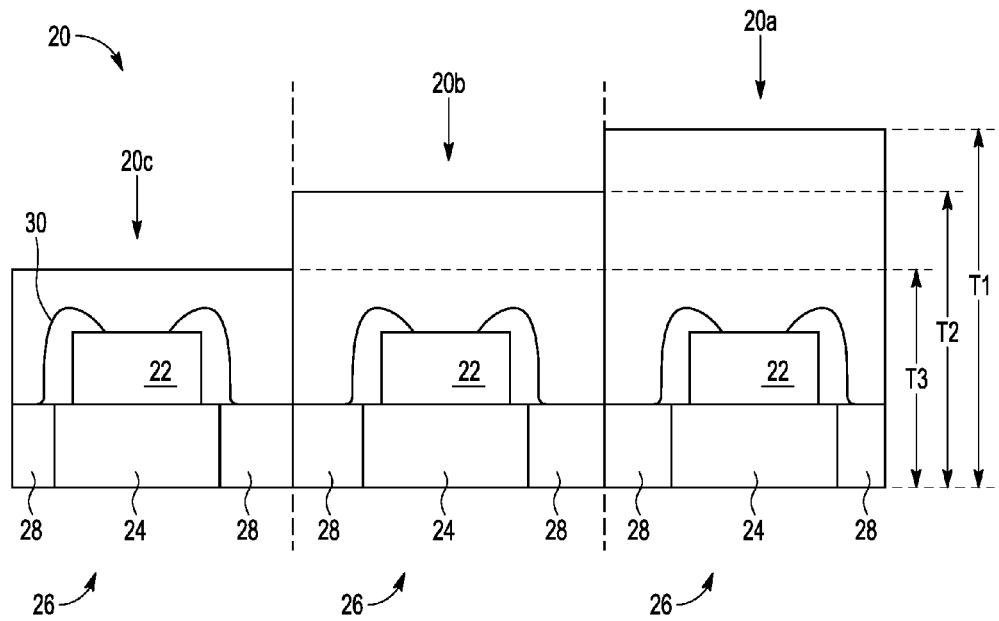
FIG. 2 is an enlarged side cross-sectional view of another embodiment of a plurality of semiconductor devices of varying thickness being assembled.

FIG. 2 is an enlarged cross-sectional side view of a plurality of packaged dies 20 having different heights or thicknesses, in accordance with another embodiment of the present invention. The packaged dies 20 are assembled simultaneously. Each packaged die 20 include die 22 having an active side including a plurality of die bonding pads and an opposite, non-active side. In this embodiment, the dies 22 are mounted on respective flags 24 of lead frames 26, and the die bonding pads are electrically connected to lead fingers 28 of the lead frames 26 with bond wires 28. The dies 22 and bond wires 30 are encapsulated with a mold compound 32. The die attach, wire bonding and encapsulation processes may be performed on each packaged die 20 at the same time, as is known in the art. Like the dies 12, the dies 22 may be any type of semiconductor dies such as microcontrollers, memory circuits, etc.

Thus, in this embodiment, a method of packaging a semiconductor die includes the steps of mounting the semiconductor die 22 on a carrier (here the lead frame 26) and attaching the die 22 thereto with a die attach adhesive, electrically connecting electrical contact pads of the semiconductor die 22 to external electrical contacts (here the lead fingers 28 of the lead frame 26) with the bond wires 30, and encapsulating the die 22 and the bond wires 30 with the mold compound 32 to form a packaged die 20.

Next saw singulation is performed to both separate the packaged dies 20 from each other and, according to the present invention, to thin some of the packaged dies 20. For example, a first cut by the dicing saw separates packaged die 20a from 20b. Then one or more second cuts are performed in which the saw blade trims a top portion of the mold compound 32 off of the packaged die 20b. For the one or more second cuts, the saw blade may be moved laterally from one side of the packaged die 20b to the opposing side of the packaged die 20b—in this case, preferably from the side of the packaged die 20b adjacent to the packaged die 20a to the opposite side, which is adjacent to the packaged die 20c. A third cut then is performed to separate the packaged die 20b from the packaged die 20c, and then one or more fourth cuts are performed to thin the packaged die 20c.

For example, as shown in FIG. 2, the packaged dies 20 all have a starting height (or thickness) of T1. After the second cuts are made, the packaged dies 20b have a height of T2, and after the fourth cuts, the packaged dies 20c have a height of T3. In one example, T1 is 850 mm, T2 is 450 mm, and T3 is 350 mm. In other examples, there are more than three rows of the packaged dies 20 mounted on an array of the lead frames 26, and the rows of packaged dies 20 are trimmed to a different height using the dicing saw. As will be understood by those of skill in the art, the dicing saw makes the first and third cuts to a depth sufficient to separate the packaged dies 20 from each other, while the second cuts are at a depth sufficient to trim enough of the mold compound 32 so that the packaged dies 20b have the height T2, and the fourth cuts are at a depth sufficient to trim enough of the mold compound 32 so that the packaged dies 20c have the height T3.

Figure 3:
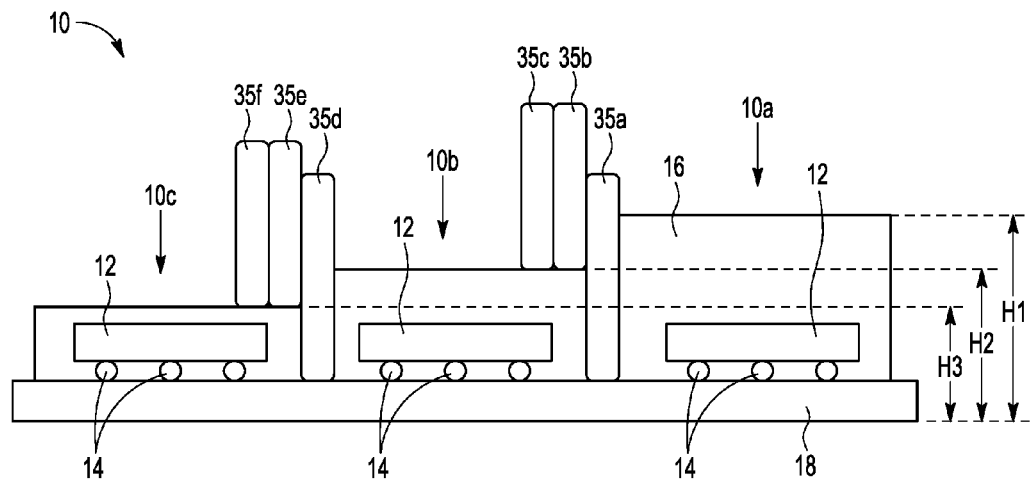
FIG. 3 is an enlarged side cross-sectional view illustrating a dicing process being performed during the assembly of the devices of FIG. 1.

FIG. 3 is an enlarged side cross-sectional view of the devices 10 shown in FIG. 1 being separated one from anther and thinned using a dicing saw 35 (shown as 35a-35f—there is actually just one blade being shown in six different positions). The packaged dies 10 may be broken down into sets, where the packaged die 10b is part of a first set, packaged die 10c is part of a second set, and packaged die 10a is part of a third set. In a first cut, the packaged die 10a of the third set is separated from the packaged die 10b of the first set with a first cut shown as 35a. This is a common saw singulation step. Next, the first set of the devices 10b is thinned using the saw blade, shown as 35b and 35c, by reducing an amount of the mold compound on the top sides of the dies of the first set 10a with the saw blade. Next the packaged dies of the first set 10a are separated from the packaged dies of the second set 10b with a conventional singulation cut shown as 35d. Then, if further thinned packages are desired, the second set of packaged dies are thinned with the saw blade, as shown by 35e and 35f, by reducing an amount of the mold compound 16 on the top sides of the dies of the second set 10b with the saw blade. In this example, the second set 10b does not include any of the packaged dies of the first set 10a, and the third set 10c does not include any of the packaged dies of either the first or second sets 10a, 10b. As can be seen the first set 10a has a height of H2, the second set has a final height of H3, and the third set remains at the original height of H3, where H3>H2>H1. An example saw blade capable of thinning a packaged die is a UniPlus Hub Blade available from Kulicke and Soffa of Willow Grove, Pa. and has a blade thickness 325 um, blade exposure 2 mm, and OD 60 mm.

Figure 4:
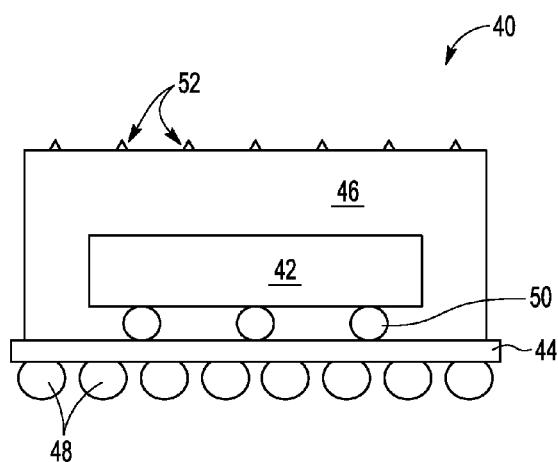
FIG. 4 is an enlarged side cross-sectional view of a semiconductor device in accordance with an embodiment of the present invention.

Referring to FIG. 4, devices thinned using the saw blade tend to have one or more rows of burrs or dicing marks on their top surfaces. A burr is a raised edge or small ridge of mold compound that remains after thinning. The rows of burrs are benign and do not have to be removed. However, it will be understood by those of skill in the art that the burrs may be removed with a deburring tool in a 'deburring' process. FIG. 4 is a side cross-sectional view of a device 40 comprising a flip-chip die 42 mounted on a substrate or redistribution layer (RDL) 44 and covered with a mold compound 46. External conductive balls 48 are attached to a bottom side of the RDL 44 and are in electrical communication with internal conductive balls 50 connected to the die 42. The top, non-active side of the device 40 includes a plurality of rows of ridges or burrs 52 that run or extend across the length of the top surface. As noted above, the burrs 52 may be removed with a deburring process, although that is not required.

Figure 5:
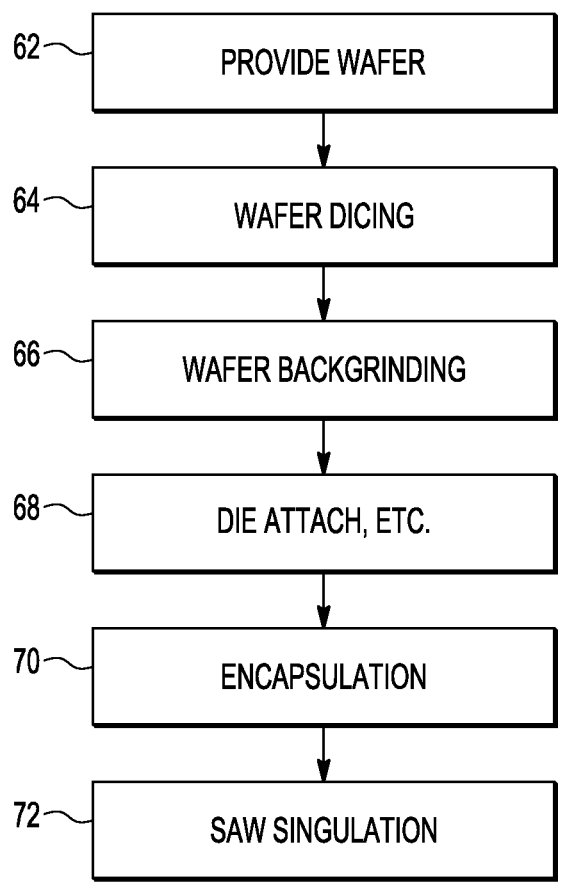
FIG. 5 is a flow chart of a method of assembling a plurality of semiconductor devices of varying thickness in accordance with an embodiment of the present invention.

FIG. 5 is a flow chart 60 illustrating a method of assembling semiconductor devices in accordance with an embodiment of the present invention. In a first step 62, a semiconductor wafer including an array of semiconductor dies is provided. As previously discussed, the dies may comprise various types of circuitry, such as a processor, controller, memory, or the like. The dies also may be of any size, such as from a die having just a few transistors to a die having hundreds of thousands or multiples thereof of transistors. In a second step 62, the wafer is diced to separate the dies one from another, as is known in the art. Alternatively, if wafer level packages (WLP) are being assembled, then the dies are not separated at this time, but further steps are performed on the wafer as a whole. Step 66 illustrates that in some embodiments the dies may be thinned prior to assembly, such as by backgrinding the wafer, as is known in the art.

At step 68, the dies are attached to a carrier. For a wire bond process the dies are attached to flags of lead frames. If the dies are flip-chip dies, then bumps or pillars may be formed on the die electrical contact pads prior to mounting the dies to a carrier, e.g. a dicing tape or a substrate such as a redistribution layer. For example, a redistribution layer may be formed on the bottom side of the dies, wherein the redistribution layer electrically connects electrical contact pads of the dies with electrical contacts on an exposed side of the redistribution layer by way of traces running through the RDL. RDLs are known in the art and the invention is not to be limited by the use or not of any particular RDL. The dies then are encapsulated or covered with a molding compound, using a known encapsulation process. Then, saw singulation is performed, only now instead of using the saw blade to only separate the molded dies one from another, the saw blade is used to cut some of the molding compound off of the tops of the packaged assemblies. This is accomplished by setting the dicing saw to cut to a predetermined depth and then the blade is moved laterally across the top of the packages (down and up, and then stepped laterally) from one side to the other.

One advantage of the present invention is that the devices may be thinned in the normal dicing step using a normal dicing saw, such that no process change or additional equipment is required to practise the present invention.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method of packaging a semiconductor die, comprising:
   mounting the semiconductor die on a carrier;
   electrically connecting electrical contact pads of the semiconductor die to external electrical contacts;
   encapsulating the semiconductor die with a mold compound to form a packaged die; and
   thinning the mold compound on a top, non-active side of the packaged die using a saw blade,
   wherein the carrier comprises a lead frame and the semiconductor die is mounted on a die pad of the lead frame and attached thereto with a die attach material, the external electrical contacts comprise lead fingers of the lead frame, and the die electrical contact pads are electrically connected to the lead fingers with bond wires.

2. The method of claim 1, wherein the mold compound covers the bond wires and at least a portion of the die.

3. A semiconductor device assembled according to the method of claim 2, wherein the semiconductor device has one or more rows of burrs on a top, nonactive surface thereof.

4. A method of packaging a semiconductor die, comprising:
   mounting the semiconductor die on a carrier;
   electrically connecting electrical contact pads of the semiconductor die to external electrical contacts;
   encapsulating the semiconductor die with a mold compound to form a packaged die;
   thinning the mold compound on a top, non-active side of the packaged die using a saw blade, wherein the carrier comprises a tape and the semiconductor die comprises a flip-chip die; and
   removing the tape from the encapsulated semiconductor die, thereby exposing an active side of the flip-chip die,
   wherein said electrically connecting electrical contact pads of the semiconductor die to external electrical contacts comprises:
      forming a redistribution layer (RDL) over the active side of the die such that electrical contacts on a first side of the RDL are in electrical communication with the die electrical contact pads, and
      attaching a plurality of conductive balls to a second side of the RDL, opposing the first side of the RDL, wherein the conductive balls allow external electrical signals to communicate with the semiconductor die.

5. A semiconductor device assembled according to the method of claim 4, wherein the semiconductor device has one or more rows of burrs on a top, nonactive surface thereof.

6. A method of simultaneously forming a plurality of semiconductor devices having different thicknesses, comprising:
   providing a plurality of simultaneously assembled semiconductor devices, the semiconductor devices comprising a plurality of semiconductor dies having top sides thereof covered with a mold compound, wherein the devices all have a first thickness;
   thinning a first set of the devices with a saw blade by reducing an amount of the mold compound on the top sides of the dies of the first set with the saw blade.

7. The method of claim 6, further comprising:
   thinning a second set of the devices with the saw blade by reducing an amount of the mold compound on the top sides of the dies of the second set with the saw blade, wherein the second set does not include any of the dies of the first set, and wherein a greater amount of the mold compound is removed from the devices of the second set such that the devices of the second set are thinner than the devices of the first set.

8. The method of claim 7, further comprising a third set of the devices that does not include any of the devices of the first and second sets, wherein the devices of the third set are not thinned with the saw blade and therefore are thicker than the devices of the first and second sets.

9. The method of claim 6, wherein the saw blade is moved over the top sides of the devices of the first set multiple times in order to reduce a thickness of the devices of the first set.

10. A semiconductor device assembled according to the method of claim 9, wherein the semiconductor device is from the first set and has a plurality of rows of burrs on the top side thereof.

11. The method of claim 6, wherein the plurality of simultaneously assembled devices are attached to a carrier, the method further comprising separating adjacent ones of the devices using the saw blade during the thinning step.

12. The method of claim 11, wherein the carrier comprises a dicing tape and the simultaneously assembled devices comprise flip-chip devices.

13. The method of claim 12, further comprising:
   removing the dicing tape, thereby exposing a bottom side of the devices; and forming a redistribution layer on the bottom side of the devices, wherein the redistribution layer electrically connects electrical contact pads of the semiconductor dies with electrical contacts on an exposed side of the redistribution layer.

14. The method of claim 11, wherein the carrier comprises a lead frame and the simultaneously assembled devices comprises wire-bond devices.

\* \* \* \* \*